United States Patent
Huang et al.

(10) Patent No.: US 8,791,551 B2
(45) Date of Patent: Jul. 29, 2014

(54) WELL-THROUGH TYPE DIODE ELEMENT/COMPONENT AND MANUFACTURING METHOD FOR THEM

(75) Inventors: Wen-Ping Huang, New Taipei (TW); Wen-Hu Wu, New Taipei (TW); His-Piao Lai, New Taipei (TW); Chien-Wu Chen, New Taipei (TW)

(73) Assignee: Formosa Microsemi Co., Ltd., New Taipei (TW)

( * ) Notice: Subject to any disclaimer, the term of this patent is extended or adjusted under 35 U.S.C. 154(b) by 303 days.

(21) Appl. No.: 13/418,452

(22) Filed: Mar. 13, 2012

(65) Prior Publication Data
US 2013/0241056 A1 Sep. 19, 2013

(51) Int. Cl.
| | | |
|---|---|---|
| *H01L 29/06* | (2006.01) | |
| *H01L 21/00* | (2006.01) | |
| *H01L 29/66* | (2006.01) | |
| *H01L 29/861* | (2006.01) | |

(52) U.S. Cl.
CPC ...... *H01L 29/66136* (2013.01); *H01L 29/8611* (2013.01)
USPC ........... 257/622; 257/738; 257/774; 257/786; 438/112; 438/613; 438/637

(58) Field of Classification Search
CPC .............. H01L 27/102; H01L 29/8611; H01L 29/8613; H01L 29/87; H01L 29/872; H01L 29/0646
See application file for complete search history.

(56) References Cited

U.S. PATENT DOCUMENTS

| | | | | |
|---|---|---|---|---|
| 7,129,558 | B2 * | 10/2006 | Skocki | 257/484 |
| 8,536,694 | B2 * | 9/2013 | Inomata | 257/690 |
| 2004/0084770 | A1 * | 5/2004 | Skocki | 257/737 |
| 2012/0326178 | A1 * | 12/2012 | Fehrer et al. | 257/88 |

* cited by examiner

*Primary Examiner* — Alonzo Chambliss (57) ABSTRACT

A well-through type diode element/component manufacturing method which has a pair (pairs) of first and said second electrodes of a diode element/component built on same plane by a process of metallization after a mode of well-through type to penetrate a PN junction depletion region/barrier region, and leads electrons of one of the electrodes to flow through the Depletion/Barrier region without hindrance; the present invention directly conduct the operations of insulation protecting, metallization and the process of elongate welding ball etc., it can independently complete a novel technique of Chip-Scale Package (CSP); it has the features of: grains being exactly the article produced, no need of connecting lines, low energy consumption, low cost and light, thin and small etc.

4 Claims, 6 Drawing Sheets

WELL-THROUGH TYPE DIODE ELEMENT/COMPONENT AND MANUFACTURING METHOD FOR THEM

BACKGROUND OF THE INVENTION

1. Field of the Invention

The present invention relates to a manufacturing method for a semiconductor/diode element or diode component; and especially to a manufacturing method which has two electrodes of a diode element built on same plane, and leads electrons to flow through an Depletion/Barrier region without hindrance by the mode of well-through type to penetrate the PN junction depletion region/barrier region, which is a manufacturing method needing the lowest cost for chip-scale package (CSP).

2. Description of the Prior Art

Generally, diode elements made of semiconductor materials can be divided by type into an axle type semiconductor and a surface adherence type semiconductor; no matter which type of the semiconductors is, its core material is semiconductor grain. By virtue that in the processes of manufacturing diode grains and articles of diode elements made of semiconductor materials, the prior art includes three kinds of processes: namely, the O/J Type, the Mesa Type and the Planar Type; the following is the synopsis of the above three kinds of processes:

1) O/J Type:
  A. Silicon wafers after diffusion are directly cut to be divided into a plurality of diode grain monomers.
  B. Copper leads are used to be welded on the front and the backsides of a diode grain monomer to make electrodes for outward connecting.
  C. The diode grain monomer is cleaned with acid, and is covered with a layer of silicon for protection.
  D. The diode grain monomer is formed thereon a shaped package and the electrodes for outward connecting are cut and bent to form pins to be welded on an electric circuit board.

2) Mesa Type:
  A. Silicon wafers after diffusion are directly cut to form open ditches and are applied with insulation material for protection, thereby a plurality of separately arrayed diode grains are formed.
  B. After the arrayed diode grains are cut and separated to form monomers, guide lines/sheet materials are used to be welded and connected onto the front and the back sides of each diode grain monomer of the electrodes for outward connecting.
  C. The diode grain monomers each is formed thereon a shaped package and the electrodes for outward connecting are cut and bent to form pins to be welded on an electric board.

3) Planar Type:
  A. The P, N electrodes are directly built on the front and the back sides of the silicon wafers; and a plurality of separately arrayed diode grains are formed using the modes of diffusion/oxide layer/ion arrangement etc.
  B. The arrayed diode grains are separated and protected with the materials of the oxide layer etc.; then the surfaces of the P, N electrodes on all the diode grains of the silicon wafers are metalized.
  C. After the arrayed diode grains on the silicon wafers are cut and separated to form diode grain monomers, the P, N electrodes on the front and the back sides are welded and connected to make outward connecting of the electrodes.
  D. The diode grain monomers each is formed thereon a shaped package and the electrodes for outward connecting are cut and bent to form pins to be welded on an electric board.

Figure 1:
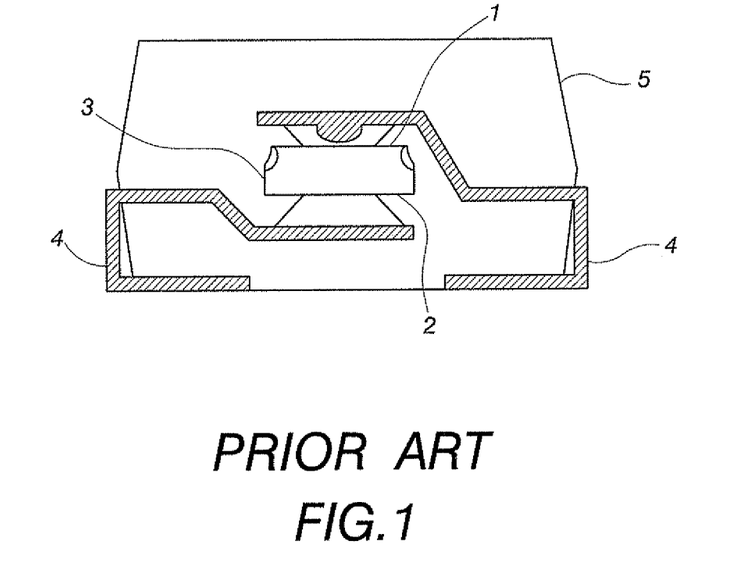
FIG. 1 is a schematic view showing the structure of a conventional diode; wherein a P electrode and an N electrode are built on two mutually contrary sides.

As shown in FIG. 1, no matter which type of the processes of manufacturing is, the common feature of the processes is that: the P, N electrodes 1, 2 are respectively built on a front and a back side of a diode grain 3, this consequently makes inconvenient of subsequent processes of welding for connecting of outward connecting electrodes 4 and forming a package 5; particularly when the P, N electrodes 1, 2 are respectively built on the front and the back side of the diode grain 3 as practiced by the prior art in order to satisfy the requirement of Chip-Scale Package (CSP), such difficulty for the processes, material or volume becomes extremely large impedance for the technique of manufacturing.

Not only this, the related diode components made of a plurality of diode grains, such as: a full-wave rectifier, an arrayed rectifier etc. are even more difficult in their processes of manufacturing by virtue that the P, N electrodes of the core material semiconductor grains likewise are respectively built on front and back sides.

In view of these, the inventor of the present invention provides a process of manufacturing and a structure of diode element/diode component having two electrodes built on the same plane, in order to largely simplify the process of manufacturing of the diode element/diode component, and to increase the efficiency of production, and the structure of the article produced is characterized in being light, thin and small which can effectively satisfy the requirement in application of the future tendency.

SUMMARY OF THE INVENTION

The main object of the present invention is to provide an innovated technique to break the limitation of manufacturing in prior technique and to have the two electrodes of a diode element/diode component built on the same plane, this not only can increase the efficiency of production, and has superiority of economic efficiency by lowering cost, but also can render its article produced to be characterized in being light, thin and small and having the function of low energy consumption.

In order to achieve the above object, the manufacturing method for a well-through type diode element/diode component of the present invention includes the following steps:

(A) A silicon wafer being completed through diffusion/oxide layer/ion arrangement etc. is provided on its top surface for a plurality of diode elements/diode components respectively with a first electrode/a plurality of first electrodes and a second electrode/a plurality of second electrodes; every first electrode is provided therearound with an insulation member/protection annulus for insulation and protection; every second electrode is provided by digging with a through well, each through well penetrates directly a PN junction depletion region/barrier region between the top layer of the silicon wafer and the bottom layer of the silicon wafer; the electric character of one of the first and second electrodes is P electrode, while the character of the other electrode is N electrode.

(B) Electric conductive material is used to metalize the first and the second electrode surfaces of every diode element/component of the silicon wafer and the through wells, to render the bottom layer of the silicon wafer to respectively electrically connect with the second electrodes of the diode elements/components, so that the first and the second electrode surfaces of the diode elements/components of the silicon wafer can be built on the same plane.

(C) The silicon wafer is cut to make mutual separation of the diode elements/components. Every individual diode element separated is a single diode article produced of a common fillip chip; every individual diode component separated is an article produced of related composed element composed of a plurality of diode grains.

In practicing the above process of manufacturing, the way of having every first electrode provided therearound with insulation member can be the way like the processes of manufacturing of the conventional Mesa Type process, in which separating ditches are provided before insulation materials are filled in; while the way of providing protection annuluses can be the way like the process of manufacturing of the conventional Planar Type process, wherein the mode of providing oxide layer or diffusion is used.

In the above processes of manufacturing, in order to reduce damage of silicon wafers or to protect the articles produced, the back sides of the silicon wafers and/or the external parts except the surface of every electrode are applied with a whole sheet of or completely applied by precast shaping with a layer of material such as epoxy resin as a protection layer. The process of manufacturing of the applied protection layer can have the surroundings of the elements of silicon wafers been provided with ditches before the above insulation materials are filled in, and then the silicon wafers are cut.

Excepting to this, in order to allow the diode elements/components produced to be expediently welded on an electric board in subsequent using, before the silicon wafers are cut, the surfaces of the electrodes after being metalized can be conducted with the process of welding ball.

When the above processes of manufacturing produce the elements/components, by having the perfect contour protection and the necessary outward connecting electrodes, the processes are call the novel Chip-Scale Package (CSP) processes; such structure has the following features:

It is a kind of well-through type diode elements/components, which is composed of at least a top and a bottom semiconductor and metal layers with different electric characteristics, the top and the bottom semiconductor and metal layers have therebetween a PN junction depletion region/barrier region, wherein the top layer at least is provided with an insulation member/protection annulus for providing a first electrode and a second electrode mutually separated on an identical surface, the second electrode further is provided with a through well which penetrates directly the PN junction depletion region/barrier region; the surfaces of the first electrode, the second electrode and the through well are covered respectively with an electric conducting layer, wherein the electric conducting layer of the through well communicates the bottom semiconductor layer with the second electrode, in order that electrons can pass the through well and easily flow through the PN junction depletion region/barrier region.

It needs to state that, in the above top and bottom semiconductor and metal layers with different electric characteristics, a normal diode element which is a P type semiconductor and an N type semiconductor and are formed after diffusion, the PN junction depletion region/barrier region is located between the P type semiconductor and the N type semiconductor of the top and the bottom layers, while a Schottky Barrier Diode is composed of a metal and a semiconductor, and the Schottky Barrier is located between the semiconductor and the metal, the barrier is exactly the above PN junction barrier region.

According to the above stated features of the well-through type diode elements/components, the insulation members are composed of the separating ditches provided around the first electrode and the insulation materials filled in the separating ditches; the protection annuluses are formed by the mode of providing the oxide layer and/or the mode of diffusion.

According to the above stated features of the well-through type diode elements/components, the electric conducting layer on the surfaces of the first electrode and the second electrode further are provided with welding balls.

According to the above stated features of the well-through type diode elements/components, the external parts except the surface of the first electrode and the second electrode are applied with a protection layer.

As compared with the prior art, after the diode elements/components of the present invention penetrate a PN junction depletion region/barrier region by the mode of well-through type, the bottom semiconductor layer directly communicates with the second electrode of the top semiconductor layer; by virtue that the semiconductor layers directly communicate internally of the elements without having external leads such as copper material, and the two electrodes of the elements are built on the same surface, thereby the elements themselves are exactly articles produced; this can lower energy consumption and increase the efficiency of the elements; not only the important resource can be saved to achieve an object of 100% getting a leadless condition, but also the size of the articles produced of the elements can be reduced to satisfy the requirement of future tendency and application of CSP (Chip-Scale Package).

In another aspect, as to the manufacturing method or the articles produced, their range of applicability can both cover the diode elements obtained by the processes of manufacturing of the conventional modes of Mesa Type or Planar Type and the related diode components which are combined by extension and combination of the aforesaid diode elements. The diode elements include, for instance: a General GPP diode, a Schottky Barrier diode, a constant voltage Zener diode, a switching diode etc.; the diode components include, for instance: a full wave rectifier, an arrayed type rectifier etc.

The present invention will be apparent in its content, structure, effect to be achieved and entire mode of operation after reading the detailed description of the preferred embodiment thereof in reference to the accompanying drawings.

DETAILED DESCRIPTION OF THE PREFERRED EMBODIMENT

Figure 2:
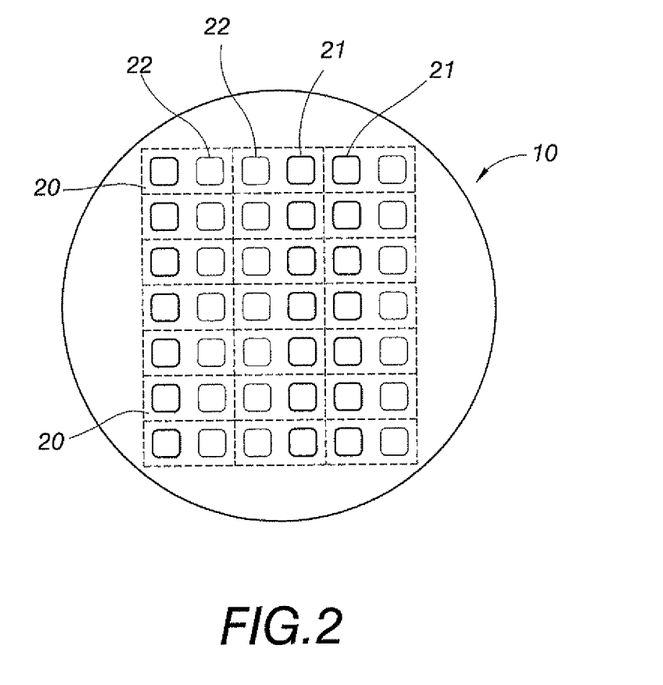
FIG. 2 is a schematic view showing a first electrode and a second electrode of each diode element on the top of a silicon wafer of the present invention.
Figure 3:
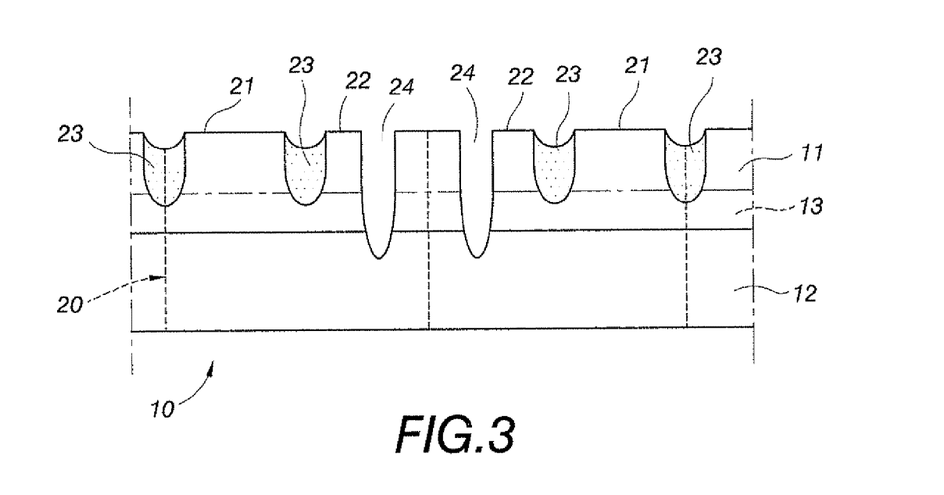
FIG. 3 is a schematic perspective view showing that each first electrode of the present invention is provided therearound with an insulation member, and each second electrode is dug to have a through well.

The well-through type diode elements/components of the present invention and their processes of manufacturing can be adequately understood through the following preferred embodiments by one who is normally skilled in the field of the presently stated techniques; however, the modes of practicing of the present invention is not limited to the following examples:

The manufacturing method of the present invention includes the following steps:

(A) As shown in FIGS. 2, 3, a silicon wafer 10 being completed through diffusion/oxide layer/ion arrangement etc. is provided on its top surface for a plurality of diode elements 20 respectively with a first electrode 21 and a second electrode 22, every first electrode 21 is provided therearound with an insulation member/protection annulus 23 for insulation and protection; every second electrode 22 is provided by digging with a through well 24, each through well 24 penetrates directly a PN junction depletion region/barrier region 13 between the top layer 11 of the silicon wafer 10 and the bottom layer 12 of the silicon wafer 10; the electric character of one of the first and second electrodes 21, 22 is P electrode, while the character of the other electrode is N electrode.

Figure 4:
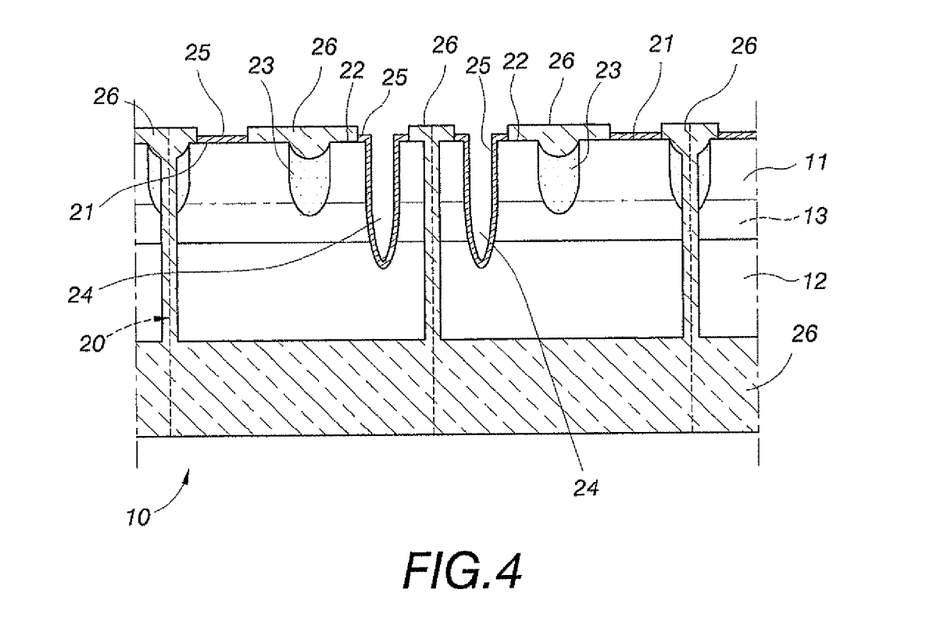
FIG. 4 is a schematic view showing that the surfaces of the first and the second electrodes and the through wells are metalized, and are applied with protecting layers.

(B) As shown in FIG. 4, electric conductive material is used to metalize the surfaces of the first and the second electrode 21, 22 of every diode element/component 20 of the silicon wafer 10 and the through wells 24 to form electrically connecting layers 25, to render the bottom layer 12 of the silicon wafer 10 to respectively electrically connect with the second electrode 22 of every diode element 20, so that the first and the second electrode surfaces 21, 22 of every diode element 20 of the silicon wafer 10 can be built on the same plane.

Figure 5:
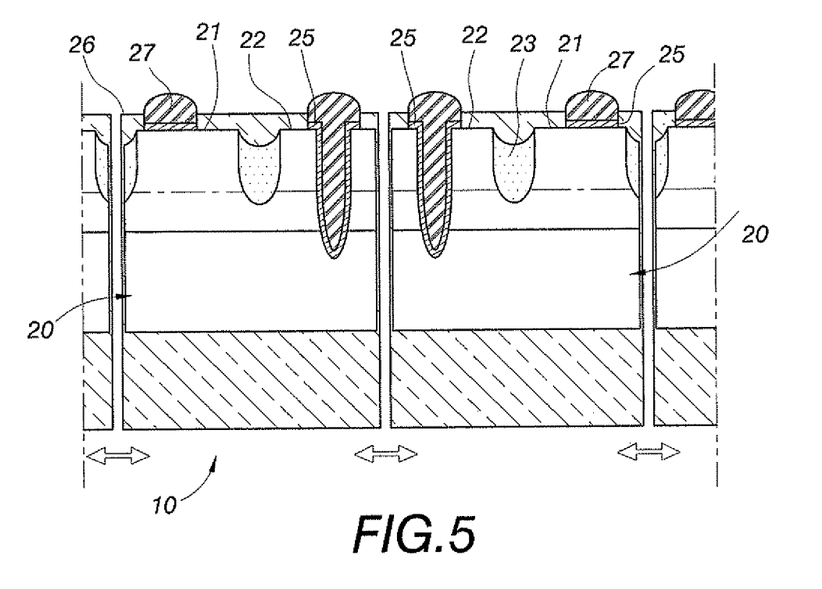
FIG. 5 is a schematic view showing that the first and the second electrodes are provided thereon with welding balls, and showing the process of being cut and separated.
Figure 6:
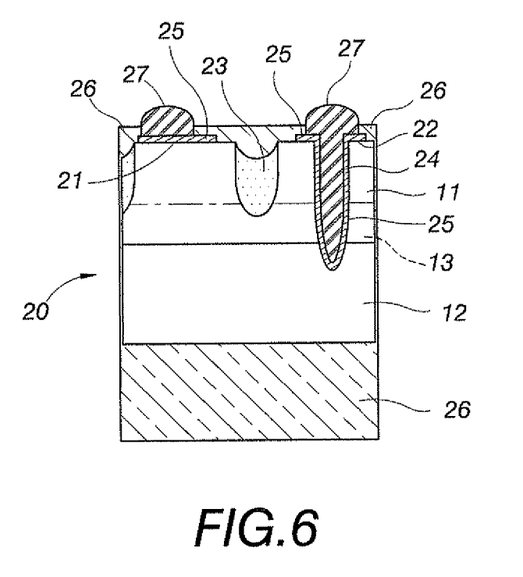
FIG. 6 is a schematic view showing the structure of a single well-through type diode element made by the manufacturing method of the present invention.
Figure 7:
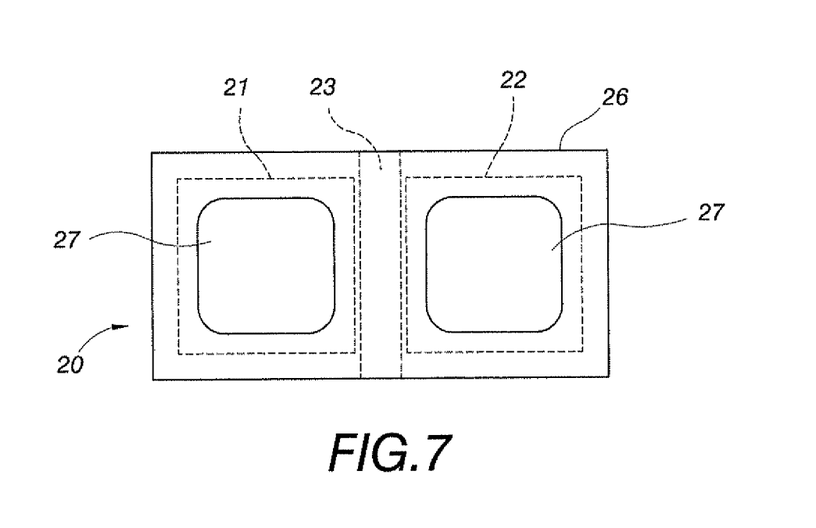
FIG. 7 is a schematic view showing the first electrode and the second electrode of the well-through type diode element of the present invention on an identical surface.

(C) As shown in FIG. 5, the silicon wafer 10 is cut to make mutual separation of the diode elements 20 on the silicon wafer 10. As shown in FIGS. 6, 7, every individual diode element 20 separated is a single diode article produced of a common fillip chip.

Referring to FIGS. 3 and 4, in the above process of manufacturing, the way of having first electrodes 21 provided therearound with insulation members/protection annuluses 23 can be the way in which separating ditches are provided before insulation materials are filled in, or can be the way wherein the mode of providing oxide layer or diffusion is used. In the drawings, insulation materials filled in the separating ditches are depicted as representation.

As shown in FIGS. 4 to 7, in the above processes of manufacturing, in order to reduce damage of silicon wafers 10, the back sides of the silicon wafers 10 and/or the external parts except the surfaces of the electrically connecting layers 25 of the electrodes 21, 22 are applied with a whole sheet of or completely applied by precast shaping with layers of material such as epoxy resin as a protection layers 26. The process of manufacturing of the applied protection layers 26 can have the surroundings of the elements of silicon wafers 10 been provided with ditches before the above insulation materials are filled in, and then the silicon wafers 10 are cut.

Excepting to this, in order to allow the diode elements 20 produced to be expediently welded on an electric board in subsequent using, before the silicon wafers 10 are cut, the surfaces of the electrodes 21, 22 after being metalized can be conducted with the process of welding ball 27.

As shown in FIGS. 6, 7, the single diode article produced in the above processes of manufacturing, has in its structure the following features:

It is a kind of well-through type diode element 20, which is composed of at least a top semiconductor/metal layer 11 and a bottom semiconductor/metal layer 12 with different electric characteristics, the top and the bottom semiconductor and metal layers 11, 12 have therebetween a PN junction depletion region/barrier region 13, wherein the top layer 11 at least is provided with an insulation member/protection annulus 23 for providing a first electrode 21 and a second electrode 22 mutually separated on an identical surface, the second electrode 22 further is provided with a through well 24 which penetrates the PN junction depletion region/barrier region 13; the surfaces of the first electrode 21, the second electrode 22 and the through well 24 are covered respectively with an electric conducting layer 25, wherein the electric conducting layer 25 of the through well 24 communicates the bottom semiconductor layer 12 with the second electrode 22, in order that electrons can pass the through well 24 and easily flow through the PN junction depletion region/barrier region 13.

In the above well-through type diode element 20, the external parts except the surface of the electric conducting layer 25 of the first electrode and the second electrode 21, 22 are applied with a protection layer 26, and the electric conducting layer 25 on the surfaces of the first electrode and the second electrode 21, 22 further are provided with welding balls 27.

The practicing mode stated above is only specified for a single diode element 20, in real practicing, the present invention can be applied for related diode components which are combined by extension and combination of the diode elements, for instance: a full wave rectifier, an arrayed type rectifier etc.

Figure 8:
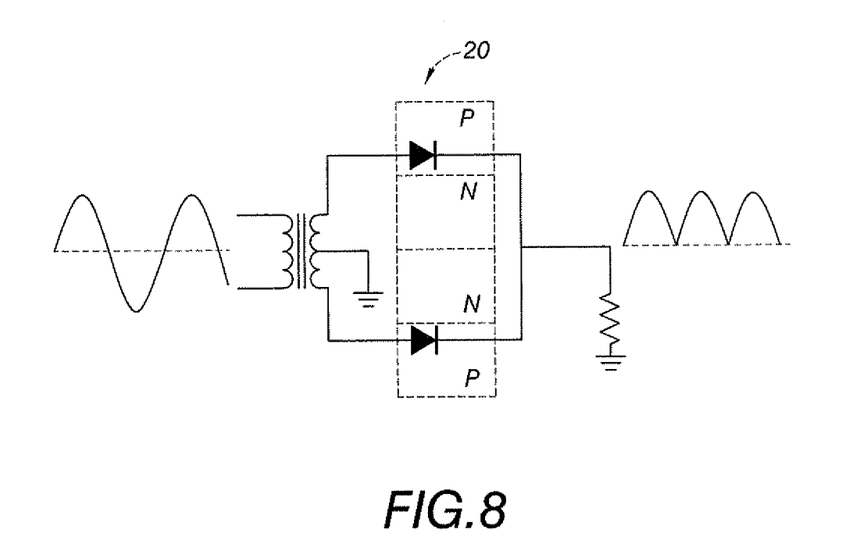
FIG. 8 is a schematic view showing a Center-Tap full-wave rectifier of the present invention.

As shown in FIG. 8 which shows an electric circuit diagram of a Center-Tap full-wave rectifier. We can see, the Center-Tap full-wave rectifier is composed of two diodes (P, N diodes). The electric characteristic of them are in an arrangement of PNNP or NPPN (it is shown in the drawing a PNNP as for example), they have three pins for outward connecting an electric circuit; hence in practicing, the two N electrodes of PNNP are mutually connected, or the two P electrodes of NPPN are mutually connected.

Figure 9:
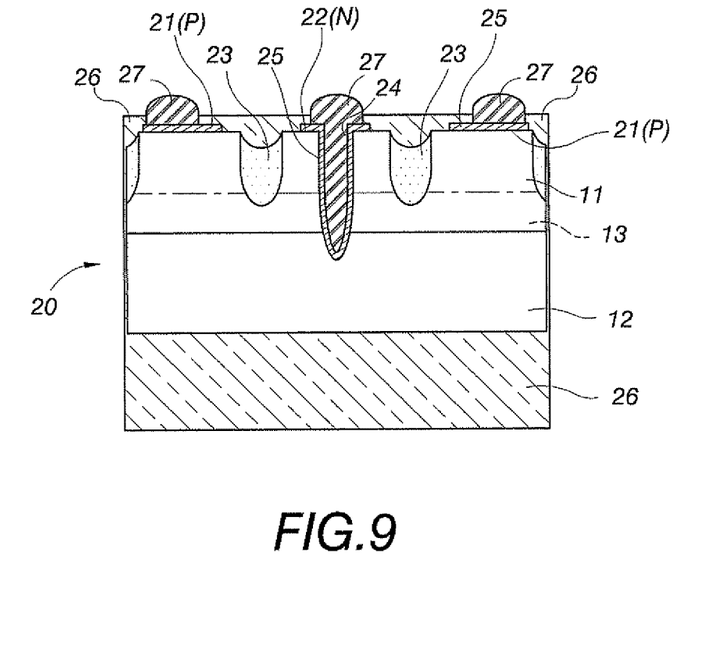
FIG. 9 is a schematic view showing the structure of a diode component of the Center-Tap full-wave rectifier of the present invention.

If the above stated well-through type diode element 20 of the present invention is made a Center-Tap full-wave rectifier, the article produced is exactly what is shown in FIG. 9. In the drawing shown, the structure of the diode element 20 is different from that of the above stated single diode element only by that it has two first electrodes 21 which are located respectively at two lateral sides of the second electrode 22; and the second electrode 22 is provided with a through well 24 penetrating the PN junction depletion region/barrier region 13, in order that electrons can pass the through well 24 and easily flow through the PN junction depletion region/barrier region 13. In connecting the above mentioned FIG. 8, the two first electrodes 21 are exactly two P electrodes, while the second electrodes 22 are exactly two mutually connected N electrodes. Other structural feature or manufacturing method as shown in FIG. 9 is same by content as the above stated, and no further narration is needed here.

The names of the members and the drawings for the present invention are only for illustrating preferred embodiments of the present invention, and not forgiving any limitation to the scope of the present invention. It will be apparent to those skilled in this art that various equivalent modifications or changes without departing from the spirit, scope and characteristic of this invention shall fall within the scope of the appended claims and are intended to form part of this invention.

The invention claimed is:

1. A well-through type diode element/diode component composed of at least a top semiconductor/metal layer and a bottom semiconductor/metal layer with different electric characteristics, said top and said bottom semiconductor and metal layers have therebetween a PN junction depletion region/barrier region, wherein said top layer at least is provided with an insulation member/protection annulus for providing a first elect ode/a plurality of first electrodes and a second electrode/a plurality of second electrodes, each pair of said first and second electrodes are mutually separated on an identical surface, every said second electrode further is provided with a through well which penetrates said PN junction depletion region/barrier region; surfaces of said first electrode (electrodes), said second electrode (electrodes) and through well (wells) are covered respectively with electric conducting layers, wherein said electric conducting layers of said through well (wells) communicate(s) said bottom semiconductor layer with said second electrode (electrodes), in order that electrons passes said through well (wells) and easily flow through said PN junction depletion region/barrier region.

2. A well-through type diode element/diode component as claimed in claim 1, wherein: said insulation members/protection annuluses are composed of separating ditches provided around said first electrode (electrodes) and insulation materials filled in said separating ditches; said protection annuluses are formed by a mode of providing an oxide layer and/or a mode of diffusion.

3. A well-through type diode element/diode component as claimed in claim 1, wherein: said electric conducting layer on said surfaces of said first electrode (electrodes) and said second electrode (electrodes) further are provided with welding balls.

4. A well-through type diode element/diode component as claimed in claim 1, wherein: external parts except surfaces of said every first electrode and every said second electrode are applied with a protection layer.

\* \* \* \* \*